US007817389B2

(12) United States Patent
Ochoa et al.

(10) Patent No.: US 7,817,389 B2
(45) Date of Patent: Oct. 19, 2010

(54) ELECTROSTATIC DISCHARGE PROTECTION DEVICE FOR HIGH SPEED TRANSMISSION LINES

(76) Inventors: Alfredo Ochoa, 4612 E. Cox Ct., Cave Creek, AZ (US) 85331; George Templeton, 1441 W. Geneva, Tempe, AZ (US) 85281; James Washburn, 3337 N. 62nd St., Scottsdale, AZ (US) 85251

( * ) Notice: Subject to any disclaimer, the term of this patent is extended or adjusted under 35 U.S.C. 154(b) by 52 days.

(21) Appl. No.: 12/379,294

(22) Filed: Feb. 18, 2009

(65) Prior Publication Data
US 2009/0251833 A1    Oct. 8, 2009

Related U.S. Application Data

(63) Continuation of application No. 11/075,416, filed on Mar. 9, 2005, now abandoned, which is a continuation of application No. PCT/US03/28377, filed on Sep. 11, 2003.

(60) Provisional application No. 60/409,568, filed on Sep. 11, 2002.

(51) Int. Cl.
*H02H 3/20* (2006.01)
*H02H 9/04* (2006.01)

(52) U.S. Cl. ......................... 361/56; 361/111; 361/91.1

(58) Field of Classification Search ................... 361/56, 361/111, 91.1
See application file for complete search history.

(56) References Cited

U.S. PATENT DOCUMENTS

| 4,303,831 | A | * | 12/1981 | El Hamamsy | 250/551 |
| 5,774,318 | A | * | 6/1998 | McClure et al. | 361/56 |
| 5,811,857 | A | * | 9/1998 | Assaderaghi et al. | 257/355 |
| 6,448,123 | B1 | * | 9/2002 | Lee et al. | 438/200 |
| 6,560,081 | B1 | * | 5/2003 | Vashchenko et al. | 361/56 |
| 6,600,356 | B1 |   | 7/2003 | Weiss | 327/310 |
| 6,861,677 | B2 | * | 3/2005 | Chen | 257/99 |

OTHER PUBLICATIONS

Application Note AN-3001 Optocoupler Input Drive Circuits, Apr. 30, 2002, 1-6, www.fairchildsemi.com/an/AN/AN-3001.pdf.*
Horowitz et al., The Art of Electronics, 1989, Cambridge University Press, 2nd edition, pp. 335-339.*
Horowitz et al., The Art of Electronics, 1989, Cambridge University Press, p. 62.*

* cited by examiner

*Primary Examiner*—Stephen W Jackson
*Assistant Examiner*—Zeev Kitov
(74) *Attorney, Agent, or Firm*—Dowell & Dowell, PC

(57) ABSTRACT

A semiconductor device for coupling a transient voltage at an input node to a reference node, the device having a bipolar transistor adapted to couple its collector to an input node and its emitter to the reference node and a driver device adapted to be coupled between the input node and the base terminal of the transistor such that the driver device is responsive to a transient voltage at the input node to turn on the transistor, thereby shunting the transient voltage to the reference node. Preferably, the input node is coupled to a high speed data transmission line that operates below 5 v and the reference node is coupled to ground and the transistor is an NPN transistor. The driver may preferably be a gate-drain connected MOS transistor with its gate-drain terminal coupled to the collector terminal of the transistor and its source terminal coupled to the base terminal of the transistor. Alternatively, the driver may be a light emitting diode (LED) or any other diode with a different material (band-gap) and die size than the LED, connected to the bipolar transistor to create a low voltage clamping device.

17 Claims, 7 Drawing Sheets

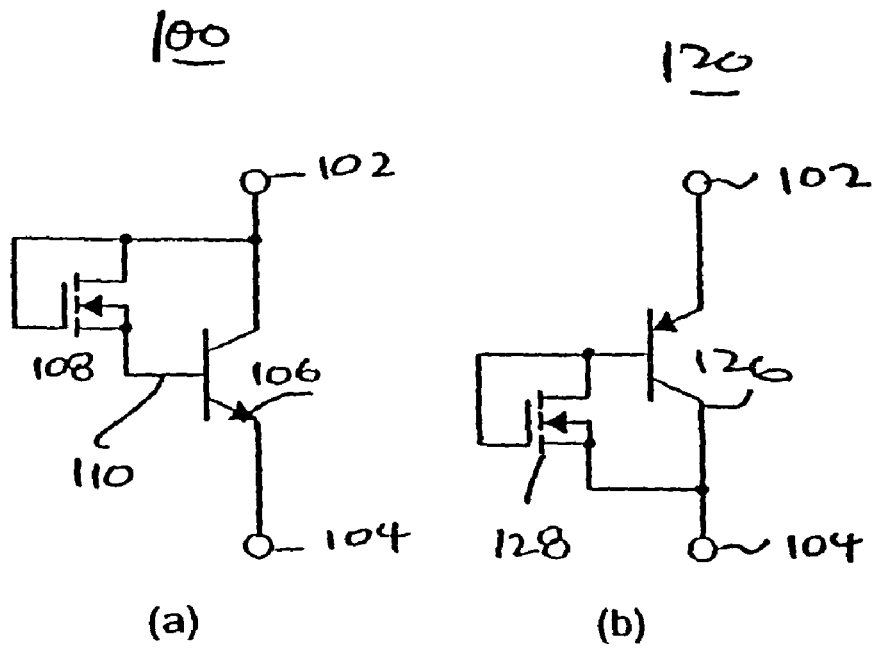
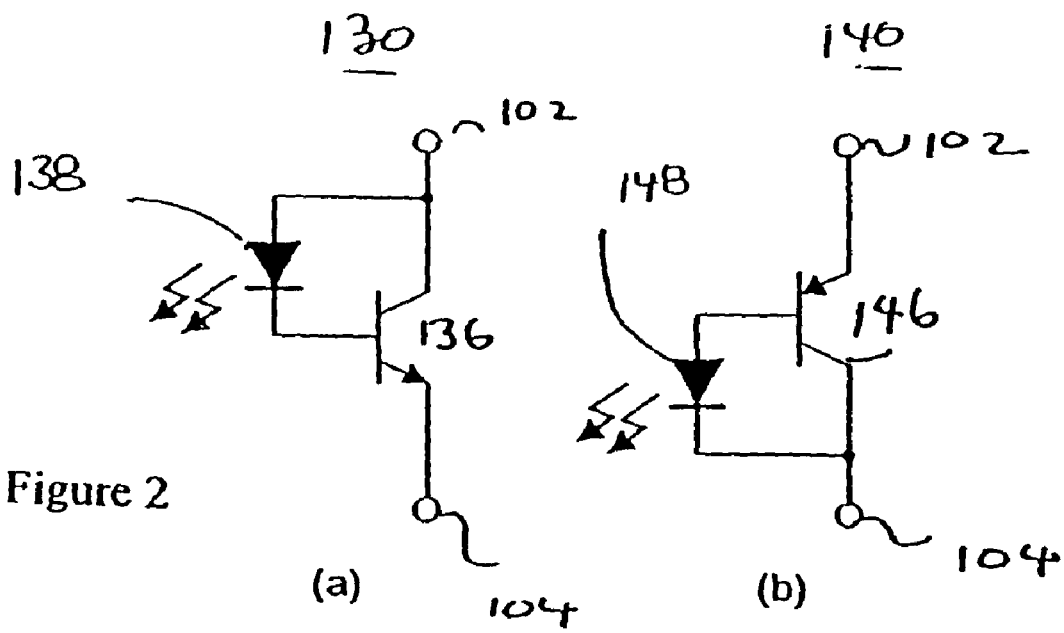
Figure 1
Figure 2

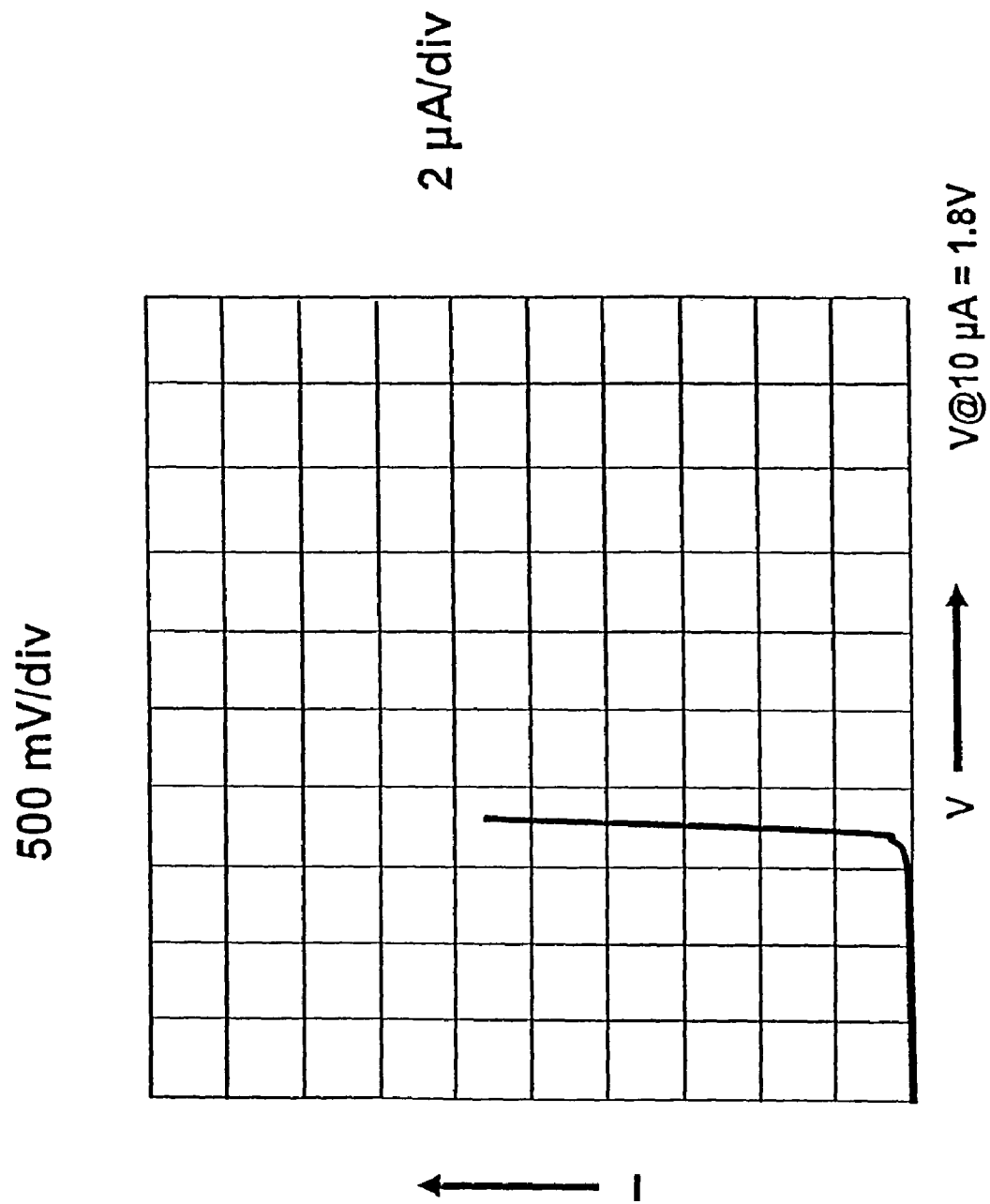

Schematic Diagram

Equivalent Circuit

ELECTROSTATIC DISCHARGE PROTECTION DEVICE FOR HIGH SPEED TRANSMISSION LINES

CROSS-REFERENCES TO RELATED APPLICATIONS

This application is a continuation of Ser. No. 11/075,416, filed Mar. 9, 2005, which is a continuation of PCT international application PCT/US03/28377, filed on Sep. 11, 2003, which claims priority to and benefit of U.S. Provisional Patent Application Ser. No. 60/409,568, filed on Sep. 11, 2002, the contents of which are enclosed in their entirety.

BACKGROUND OF THE INVENTION

1. Field of the Invention

The present invention relates to a circuit for protecting transmission lines against transients, such as those caused by Electrostatic Discharge (ESD); more particularly, the invention relates to a semiconductor device having low capacitance and low leakage and which is useful for the protection of high speed data transmission lines which typically operating at voltages below 5V.

2. Description of the Related Art

With the increase in performance and component density of digital electronic circuits, which is due in part to improved sub-micron masking processes, there is a corresponding need to reduce power supply voltages to these circuits in order to reduce the internal power dissipation of the circuitry. A further advantage of the lower voltage power supply and corresponding low power consumption is the possibility of operating these circuits at higher clock speeds a heretofore possible.

Conventional logic voltage levels have generally decreased from the typical 5V range to 1.5V or lower. It is predicted that this logic voltage level will further decrease to the sub-one volt level in the next few years. Similarly, it is anticipated that the masking process will decrease from 1.5 microns to less than a few hundredths of a micron in the next few years.

A disadvantage of this increased scale of integration is that semiconductor devices, in particular metal oxide semiconductor (MOS) transistors, are now more susceptible to damage by over-voltage transient pulses. These pulses are generally caused by electrostatic discharge pulses or positive or negative voltage spikes generated during switching or just caused by the inductive effect of a transmission line impedance. A further cause of damage is as a result of accidental connection to the wrong voltage supply levels as, for example, by connecting a 5V supply voltage to a 2.5V or a 1.5V input on a device.

Many solutions to this problem have been proposed, such as the use of a single P-N (transient voltage suppressor) TVS/Zener device or clamp. However, these devices are ineffective in these low voltage applications since it is difficult to achieve low leakage levels at supply voltages below 5V. Another solution is to use steering diode line termination circuitry. However, these are effective to minimize the overshoot and undershoot switching events that could be absorbed in part by the power supply, but under an extremely fast transient event, as in an ESD, the circuitry could be damaged.

Currently some semiconductor component manufacturers, like SEMTECH Corp, offer very low leakage TVS/Zener devices, such as their part No. SLVU2.8, which is capable of handling ESD and transient protection levels intended for 3.3V systems. These devices are based on Low-voltage Punch-Through concept as described in U.S. Pat. No. 6,015,999.

A disadvantage of the above described devices is that they must be coupled in series with a rectifier diode in order to achieve capacitance levels in the order of 10 pF or below, so as to exhibit a low insertion loss.

These low capacitance values are necessary in order that the protection devices can be used to protect against ESD and transient events on high speed transmission data line ports, such as 10/100/1000 Ethernet, USB 1.1 and 2.0 and FireWire-IEEE 1394 or similar.

Other device solutions are described in U.S. Pat. Nos. 6,442,008; 6,163,446; 6,492,859; 6,268,639; 6,320,735; 6,015,999 and 6,268,990. However, for various reasons these devices do not exhibit the low leakage and low capacitance required for low voltage applications.

Accordingly there is a need for a protection device that exhibits low capacitance, low leakage at low voltages and that can preferably be used to protect high speed transmission lines.

BRIEF SUMMARY OF THE INVENTION

An advantage of the present invention is to provide transient protection device for low voltage circuits.

In a preferred embodiment the device may be used as a transient voltage suppressor or ESD protector for high speed data transmission lines.

In accordance with this invention there is provided a semiconductor device for coupling a transient voltage from an input node to a reference node, the device comprising:

a) a bipolar transistor adapted to couple its collector to the input node and its emitter to the reference node; and b) a driver device adapted to be coupled between the input node and the base terminal of the transistor such that the driver device is responsive to a transient voltage at the input node to turn on the transistor, thereby shunting the transient voltage to the reference node.

In a preferred embodiment the input node is coupled to a high speed data transmission line and the reference node is coupled to ground.

It is further preferred that the transmission line operates below 5 v and the transistor is an NPN transistor.

The driver may preferably be a gate-drain connected MOS transistor with its gate-drain terminal coupled to the collector terminal of the transistor and its source terminal coupled to the base terminal of the transistor. Alternatively the driver may be a light emitting diode (LED) or any other diode with a different material (band-gap) and die size than the LED, connected to the bipolar transistor to create a low voltage clamping device.

An advantage of the present invention is that it provides a low voltage clamping device having a stable breakdown or "zener" voltage characteristic in applications operating at low voltages while providing low leakage and low capacitance.

BRIEF DESCRIPTION OF THE DRAWINGS

Embodiments of the invention may best be understood by referring to the following description and accompanying drawings wherein:

FIGS. 1(a) and (b) are schematic diagrams of a device configuration according to embodiments of the present invention;

FIGS. 2(a) and (b) are schematic diagrams of a device configuration according to further embodiments of the present invention;

DETAILED DESCRIPTION OF THE PREFERRED EMBODIMENTS

Figure 3:
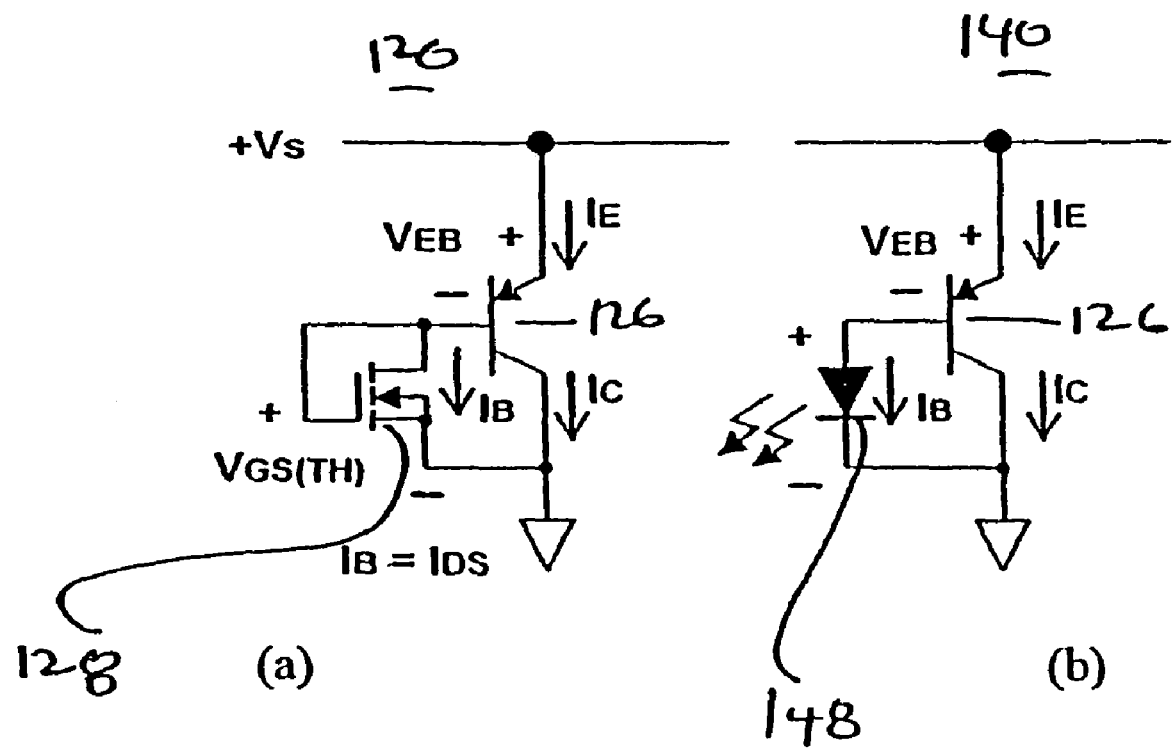
FIGS. 3(a) and (b) are schematic diagrams showing operation of the devices of FIGS. 1(a) and (b)

In the following description, numerous specific details are set forth to provide a thorough understanding of the invention. However, it is understood that the invention may be practiced without these specific details. In other instances, well-known structures or and/or processes have not been described or shown in detail in order not to obscure the invention. In the description and drawings, like numerals refer to like structures or processes. The operation of semiconductor devices such as MOS and bipolar transistor devices are well known in the art and will not be described further except where necessary to clarify aspects of the invention.

Referring to FIG. 1(a) there is shown a first embodiment of semiconductor protection device 100 for coupling a transient voltage from an input node 102 to a reference node 104. The device 100 includes an NPN bipolar transistor 106 having its collector terminal coupled to the input node 102 and its emitter terminal coupled to the reference node 104. An N-channel MOSFET 108 is configured as a driver device by having its drain-gate terminals coupled to the collector terminal of the transistor 106 and its source terminal coupled to the base terminal 110 of the transistor 106 such that the MOSFET 108 is responsive to a transient voltage at the input node 102 to turn on the transistor 106, thereby shunting the transient voltage to the reference node 104.

Referring to FIG. 1(b) there is shown a second embodiment 120 of the protection device 100. In this embodiment 120, the bipolar transistor, is a NPN device 126 and the N-channel MOSFET 128 has its drain-gate terminal coupled to the gate of the transistor 126 and the source terminal is coupled to the collector. The emitter-collector terminals are connected as above between the input and reference nodes.

Referring to FIGS. 2(a) and (b), third and fourth embodiments 130, 140, which are similar devices to those of FIGS. 1(a) and (b) are shown; however in these embodiments the N-channel MOSFETs 108, 128 are replaced by LEDs 138, 148. In FIG. 2(a) the anode terminal of the LED 138 is connected to the collector terminal of the transistor 136 and the cathode terminal to the base of the NPN transistor 136, whereas in the case of a PNP transistor 146 shown in FIG. 2(b), the anode of the LED 148 is connected to the base of the transistor 146 and the cathode to the collector. The LED may be any color or any other diode made of such material (bandgap) and size that could give the desired driving voltage. Once again the devices 130, 140 are connected between the input node and reference node.

The operation of the devices of the present invention may be explained by referring to FIGS. 3(a) and 3(b) in which the devices correspond to the embodiments 120, 140 illustrated with respect to FIGS. 1(b) and 2(b), respectively. In general either the N-channel MOSFET 128 or the LED 148 are the driver devices when in combination with the bipolar transistor 126. The MOSFET is connected as described to convert it to a voltage reference, having its drain-to-source voltage fixed and being equivalent to the gate-to source threshold voltage, typically around 2V to 3V. This has a sharp voltage knee characteristic. In the case of the LED, the voltage drop across the device is typically 1.7V for conventional red, green or amber LED's, and 3.6V for Blue and White LED's.

Referring to FIGS. 3(a) and 3(b), it is assumed that the PNP Transistor combinations are connected between a voltage bus represented by +Vs (input node) and ground (reference node). In the drawings, VEB is the emitter-base voltage for the transistor; IC, EB and IE are the corresponding collector, base and emitter currents; VF is the forward voltage and VGS is the gate-source threshold voltage of the MOSFET and IDS is its drain-source current. In normal operation the device is in the off-state, that is $Vs < VEB + VGS(TH)$ where $VEC = VEB + VGS(TH)$ or, $Vs < VEB + VF$ where $VEC = VEB + VF$ In this off-state condition there is a negligible current flowing from the emitter to collector of the transistor since there is not enough current flowing through the base of the transistor to turn it on. If Vs is increased enough to be equal the emitter-collector voltage, that is $Vs + \text{Delta } Vs = VEC$ the device starts to act as a TVS/Zener diode with a "Zener voltage" determined by the VEC (that is equal to VEB+VGS (TH) for the MOSFET or VEB+VF for the LED), and an initial small current flows (order of microamperes) from the emitter to the collector, since there is now sufficient current flowing through the transistor base. As the voltage between emitter (or the "cathode") and the collector (or the "anode") goes higher, the current also flowing through the emitter-collector is higher because more base current is also flowing through it. The transistor gain acts to "square" the diode forward characteristic, or the gate-to source voltage characteristic in case of the MOS transistor configurations shown in FIGS. 1(a) and 1(b).

Figure 4:
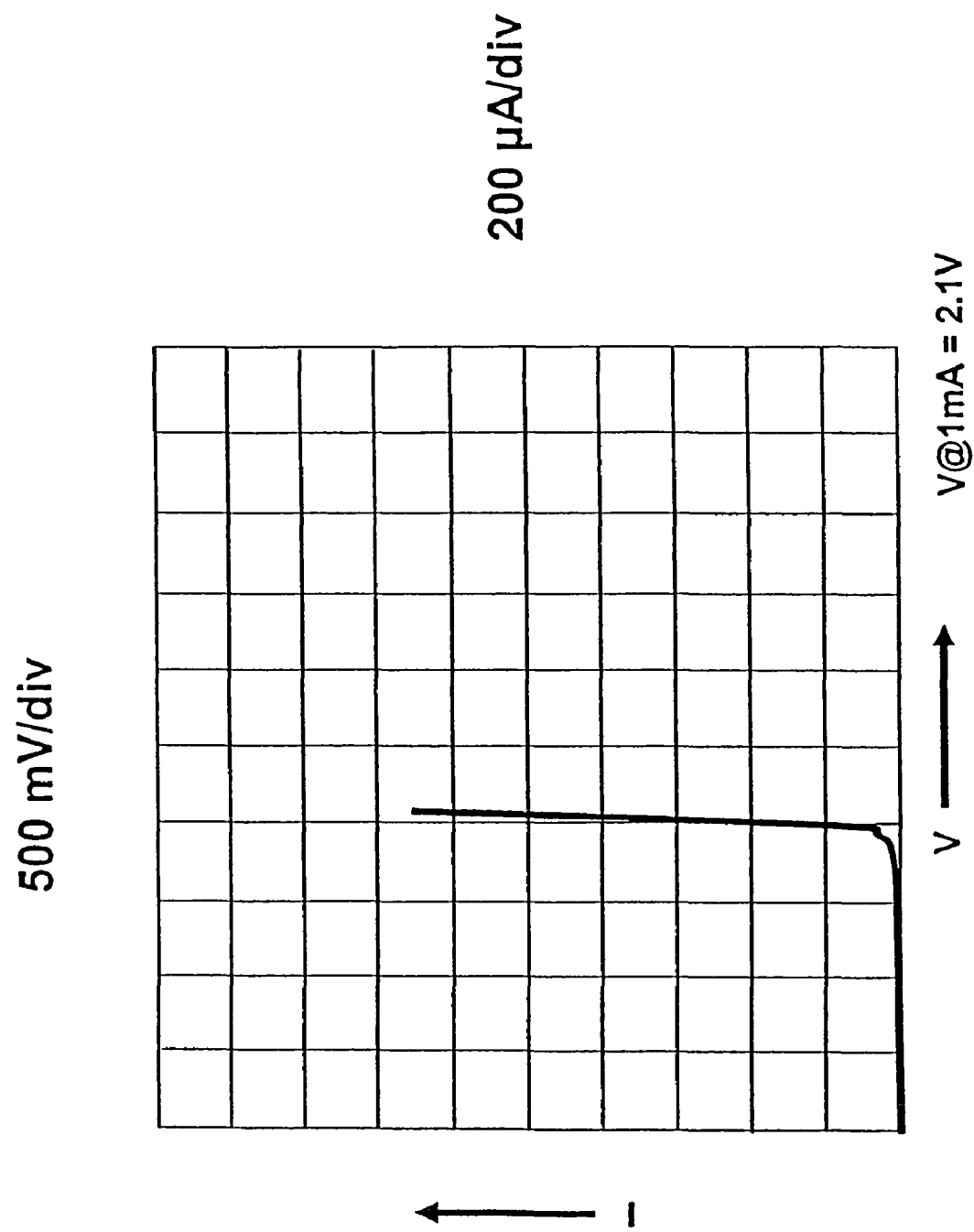
FIGS. 4(a), (b) and (c) show schematically voltage-current traces for the device of the present invention.
Figure 4:
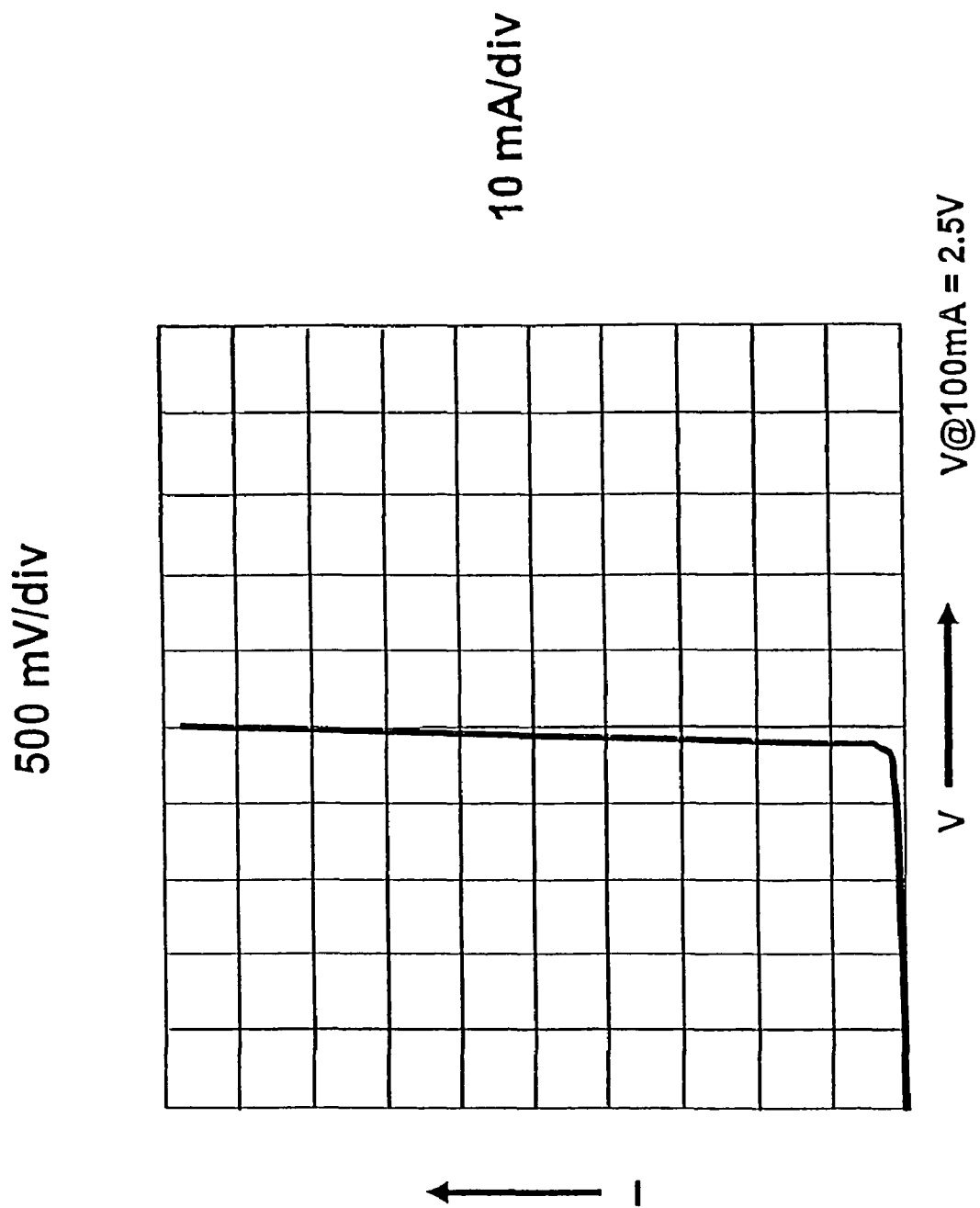

Referring to FIGS. 4(a) to (c), there is shown the emitter-collector voltage versus current characteristic traces at three levels of current: namely 2 microamps; 200 microamps 10 milliamps, showing graphically the operation of the devices for a Red LED and a PNP transistor combination of the present invention.

In terms of off-state capacitance, it has been observed that the MOSFET-bipolar or LED-bipolar device combinations of the present invention depend merely on the output capacitance of the transistor, which can be tailored to be smaller than any low voltage TVS/Zener.

The transistor may be selected to be small enough to have an off-state capacitance of around 6-7 pF, with a maximum of 10 pF. This is significantly lower than that of a conventional 2.5V 1/2 W Zener, which has 290 pF, or the punch-through structure used on the SLVU2.8 (without the diode in series) of 30 pF, at 1 MHz 0.1 Vrms signal and zero dc bias.

The lower capacitance value represents less insertion loss at upper band frequencies required on a USB (6 MHz and 240 MHz) transmission line or FireWire (200 MHz).

The flexibility of the devices of the present invention allows also for the increase in the surge voltage by changing the bipolar transistor size, thereby reducing the switching resistance.

Figure 5A:
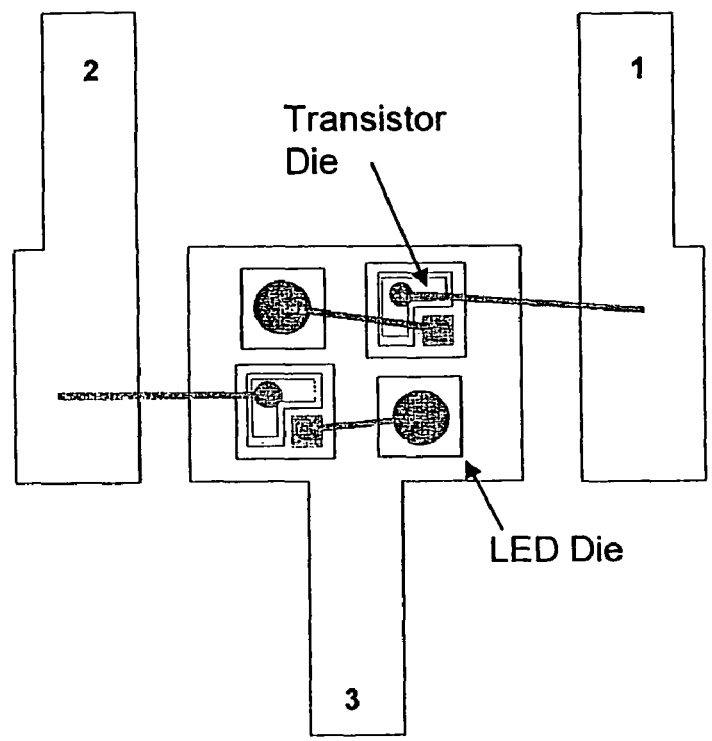
FIGS. 5(a), (b) and (c) show respectively a die layout, a schematic diagram and equivalent circuit for a two device configuration according to the present invention.
Figure 5B:
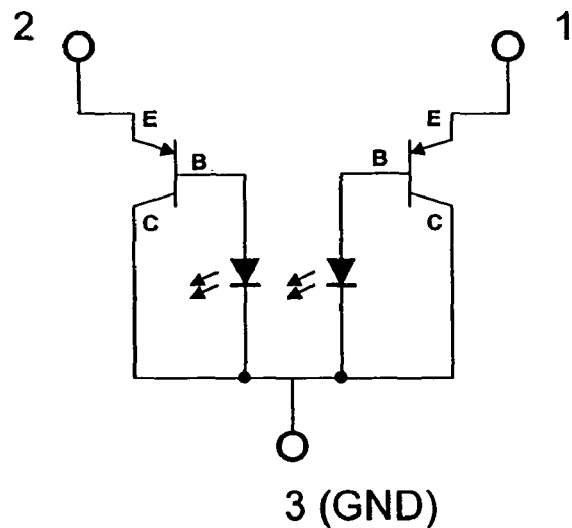
Figure 5C:
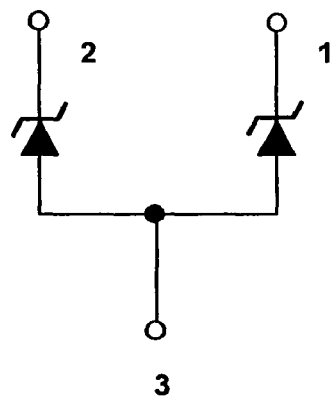

An advantage of the present invention is that it can be easily constructed using standard components that allow the number of devices to be easily scaled for a particular application. For example, FIGS. 5(a), (b) and (c) show respectively a die layout, a corresponding schematic diagram and equivalent circuit for a two device configuration according to the present invention.

Figure 6:
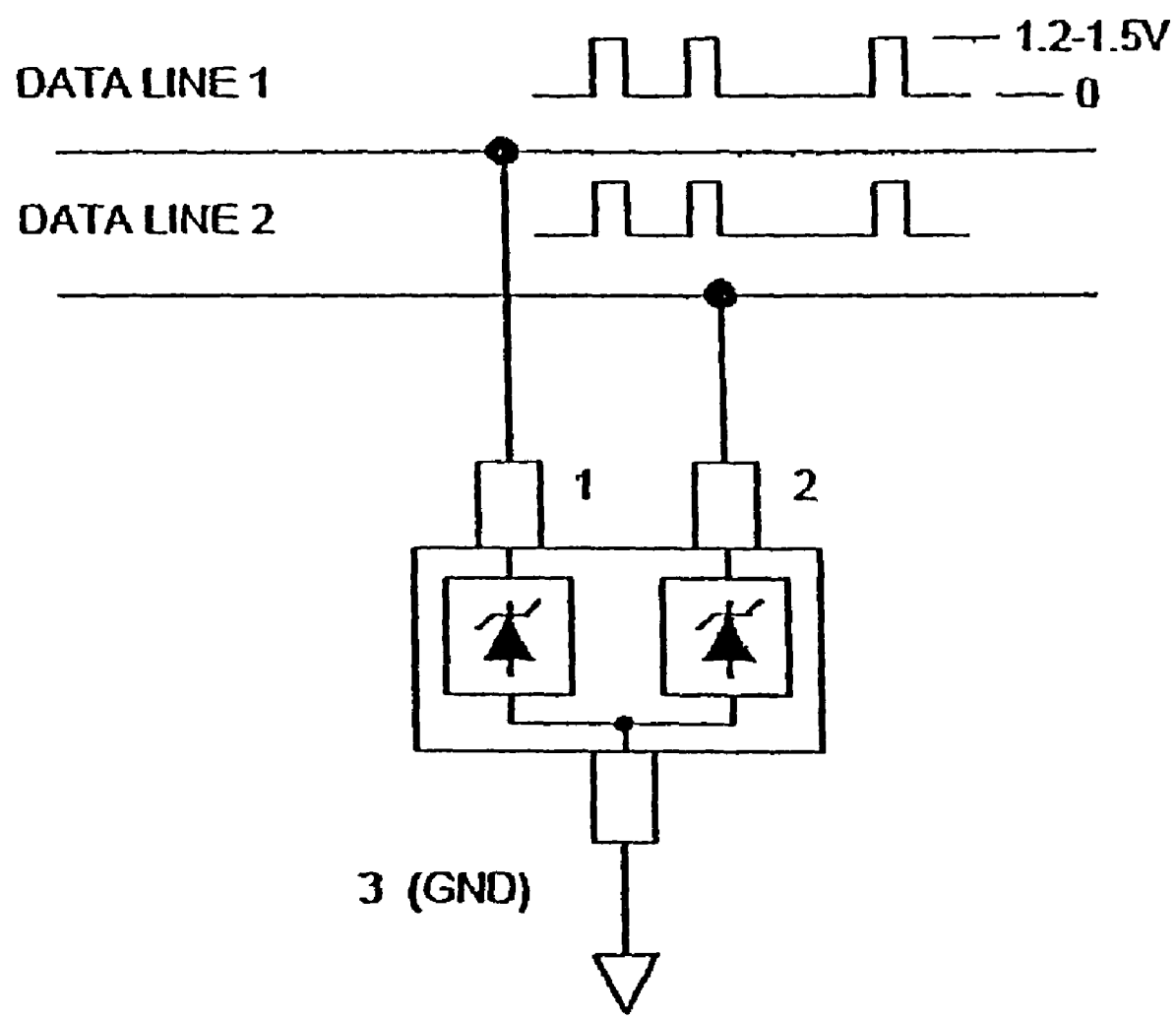
FIG. 6 shows a schematic diagram for connecting a pair of devices, according to the present invention, to a pair of data lines.

FIG. 6 shows a schematic diagram for connecting the pair of devices to a corresponding pair of data lines or input nodes according to an embodiment of the present invention.

In general the devices are unidirectional, but could offer a bi-directional protection (for negative spikes) if connected as a pair in anti-parallel. The maximum blocking voltage in reverse mode is about 7-8V but is not intended to operate in reverse mode. In terms of insertion loss the device is fully dependable on the transmission line used. Under USB 1.1 or 2.0 or IEEE 1394 (Fire Wire) the device could add no more than 3 dB attenuation at 240 MHz.

Although preferred embodiments of the invention have been described herein, it will be understood by those skilled in the art that variations may be made thereto without departing from the spirit of the invention or the scope of the appended claims.

What is claimed is:

1. A semiconductor device for coupling an electrostatic discharge (ESD) transient voltage from an input node of a high speed data transmission line to a reference node, the device comprising:
   a) a bipolar transistor adapted to have its emitter collector circuit coupled between the input node and the reference node, the transistor operable to conduct a current from the input node to the reference node; and
   b) a light emitting diode (LED) adapted to be coupled directly between only the collector terminal and the base terminal of the transistor for maintaining the transistor in an off state when an operating voltage of 5 v or less is applied to the input node and, without breakdown, being responsive to an ESD transient voltage at the input node to turn on the transistor to shunt the transient voltage to the reference node, the voltage at which the transistor turns on corresponding to the driver forward voltage and the emitter-base voltage of the transistor.

2. A device as defined in claim 1, wherein the transistor is a NPN device.

3. A device as defined in claim 1, wherein the transistor is a PNP device.

4. A device as defined in claim 1, where the transmission line operates below 5 v and the reference node being coupled to ground terminal.

5. A device as defined in claim 1, wherein the device having a plurality of input nodes and a corresponding number of transistor and LEDs.

6. A device as defined in claim 1, wherein the transistor having an off state capacitance of less than 10 pf.

7. A devices as defined in claim 1, wherein the LED is selected based upon a desired band-gap and size that provides a desired driving voltage.

8. A device as defined in claim 1, wherein the LED is a red, green, or amber LED having a typical voltage drop of 1.7V.

9. A device as defined in claim 1, wherein the LED is a blue or white LED having a typical voltage drop of 3.6V.

10. A method for coupling an electrostatic discharge (ESD) transient voltage from an input node of a high speed transmission line to a reference node, the method comprising:
    a) coupling an emitter collector circuit of a bipolar transistor between the input node and the reference node to conduct a current from the input node to the reference node; and
    b) coupling a light emitting diode (LED) directly between only the collector terminal and the base terminal of the transistor for maintaining the transistor in an off state when an operating voltage of 5 v or less is applied to the input node and without breakdown being responsive to an ESD transient voltage at the input node to turn on the transistor, to shunt the transient voltage to the reference node, the voltage at which the transistor turns on corresponding to the driver forward voltage and the emitter-base voltage of the transistor.

11. A method as defined in claim 10, wherein the transistor is a NPN device.

12. A method as defined in claim 10, wherein the transistor is a PNP device.

13. A method as defined in claim 10, wherein the LED is selected based upon a desired band-gap and size that provides a desired driving voltage.

14. A method as defined in claim 1, wherein the device having a plurality of input nodes and a corresponding number of transistor and LEDs.

15. A method as defined in claim 10, wherein the transistor having an off state capacitance of less than 10 pf.

16. A method as defined in claim 10, wherein the LED is a red, green, or amber LED, having a voltage drop of 1.7V.

17. A method as defined in claim 10, wherein the LED is a blue or white LED, having a voltage drop of 3.6V.

* * * * *